(12) United States Patent
Lee (10) Patent No.: US 9,402,335 B2
(45) Date of Patent: Jul. 26, 2016

(54) OIL COOLING DEVICE FOR SERVER AND METHOD FOR DRIVING SAME

(71) Applicant: Chung Jong Lee, Seoul (KR)

(72) Inventor: Chung Jong Lee, Seoul (KR)

( * ) Notice: Subject to any disclaimer, the term of this patent is extended or adjusted under 35 U.S.C. 154(b) by 67 days.

(21) Appl. No.: 14/396,726

(22) PCT Filed: Jan. 28, 2013

(86) PCT No.: PCT/KR2013/000650
§ 371 (c)(1),
(2) Date: Oct. 23, 2014

(87) PCT Pub. No.: WO2013/162158
PCT Pub. Date: Oct. 31, 2013

(65) Prior Publication Data
US 2015/0103490 A1    Apr. 16, 2015

(30) Foreign Application Priority Data
Apr. 24, 2012 (KR) .................. 10-2012-0042812

(51) Int. Cl.
*H05K 7/20* (2006.01)
*G06F 1/20* (2006.01)
*H01L 23/473* (2006.01)

(52) U.S. Cl.
CPC ............ *H05K 7/20836* (2013.01); *G06F 1/206* (2013.01); *H05K 7/2079* (2013.01);
(Continued)

(58) Field of Classification Search
CPC . G06F 1/181–1/182; H05K 7/20218–7/20381; H05K 7/20409–7/20418; H05K 7/20009–7/202; H01L 23/367–23/3677; H01L 23/473; H01L 23/46–23/467
USPC ........................ 361/676–678, 679.46–679.54, 361/688–723; 165/80.1–80.5, 104.33, 185; 174/15.1–15.3, 16.1–16.3, 547, 548; 257/712–722, E23.088; 24/453, 24/458–459; 454/184; 312/236
See application file for complete search history.

(56) References Cited

U.S. PATENT DOCUMENTS 5,050,037 A * 9/1991 Yamamoto .......... H01L 23/4332
165/80.4
5,195,020 A * 3/1993 Suzuki ................ H01L 23/4332
257/714
(Continued)

FOREIGN PATENT DOCUMENTS

JP        06-307655 A    11/1994
KR     10-0174120 B1     5/1999
(Continued)

*Primary Examiner* — Anthony Haughton
*Assistant Examiner* — Razmeen Gafur
(74) *Attorney, Agent, or Firm* — Novick, Kim & Lee, PLLC; Jae Youn Kim (57) ABSTRACT

The present invention relates to an oil cooling device for a server and a method for driving the same. The oil cooling device for the server comprises: a server tower having a flow passage into which insulating cooling oil flows; a heat absorbing part for absorbing the heat generated from a heat-generating electronic device within the server tower; a cooling oil tube which is connected to an external cooling device from the flow passage of the server tower; a hydraulic pump for circulating the cooling oil of the cooling oil tube; a first temperature sensor which is provided inside the server tower and detects a change in temperature; a storage tank for generating hot water, which enables the cooling oil tube to come in contact with cooling water so as to perform a primary cooling step; a heater for enabling the cooling oil tube cooled through the primary cooling process to come in contact with the air so as to perform a secondary cooling process; a second temperature sensor which is provided inside the cooling oil tube and measures the temperature of the cooling oil tube; a residual-heat processing part for performing a third cooling step using a small-sized and low-power cooler provided in the cooling oil tube cooled through the second cooling step; and a control unit for controlling operations of the hydraulic pump and the residual heat processing unit according to measured values from the first and second temperature sensors on the basis of reference temperature data. The present invention can save energy by using the condensation heat generated from the electronic device which generates heat in a large scale server tower for an enterprise so as to enable heat and hot water to be used, and can efficiently cool the server tower through a total of three cooling steps.

12 Claims, 8 Drawing Sheets

(52) U.S. Cl.
CPC ........ *H05K7/20145* (2013.01); *H05K 7/20263* (2013.01); *H05K 7/20272* (2013.01); *H05K 7/20718* (2013.01); *H05K 7/20763* (2013.01); *G06F 2200/201* (2013.01); *Y02B 60/1275* (2013.01)

(56) References Cited

U.S. PATENT DOCUMENTS

| | | | | |
|---|---|---|---|---|
| 6,313,990 | B1 | 11/2001 | Cheon | |
| 2004/0020213 | A1* | 2/2004 | Jones | F28D 15/02 60/772 |
| 2004/0104012 | A1* | 6/2004 | Zhou | H01L 23/427 165/104.26 |
| 2005/0244691 | A1* | 11/2005 | Varenne | B60L 11/1803 180/65.31 |
| 2006/0002086 | A1* | 1/2006 | Teneketges | H01L 23/473 361/699 |
| 2007/0012423 | A1* | 1/2007 | Kinoshita | H01L 23/473 165/80.4 |
| 2007/0089859 | A1* | 4/2007 | Wei | G06F 1/20 165/80.4 |
| 2007/0133172 | A1* | 6/2007 | Cheon | G06F 1/20 361/699 |
| 2008/0068793 | A1* | 3/2008 | Ishimine | G06F 1/206 361/688 |
| 2008/0209931 | A1* | 9/2008 | Stevens | H05K 7/20763 361/699 |
| 2008/0266798 | A1* | 10/2008 | Eckberg | H05K 7/20272 361/699 |
| 2009/0027856 | A1* | 1/2009 | McCoy | G06F 1/20 361/699 |
| 2009/0116183 | A1* | 5/2009 | Mundt | G06F 1/20 361/679.46 |
| 2009/0154104 | A1* | 6/2009 | Kondo | G06F 1/20 361/700 |
| 2009/0199553 | A1* | 8/2009 | Nishimura | E02F 9/2292 60/486 |
| 2010/0103620 | A1* | 4/2010 | Campbell | H05K 7/20772 361/702 |
| 2010/0254089 | A1* | 10/2010 | Anderl | H01L 23/4093 361/702 |
| 2010/0277863 | A1* | 11/2010 | Tozer | H05K 7/20827 361/679.47 |
| 2010/0290190 | A1* | 11/2010 | Chester | H05K 7/20772 361/701 |
| 2011/0176273 | A1* | 7/2011 | Olsen | G06F 1/20 361/679.47 |
| 2011/0292600 | A1* | 12/2011 | Campbell | F24F 3/14 361/691 |
| 2011/0313576 | A1* | 12/2011 | Nicewonger | F28D 15/00 700/282 |
| 2011/0317365 | A1* | 12/2011 | Tang | H05K 7/20772 361/699 |
| 2012/0050993 | A1* | 3/2012 | Suzuki | H05K 7/20936 361/700 |

FOREIGN PATENT DOCUMENTS

| | | |
|---|---|---|
| KR | 10-1152732 B1 | 6/2012 |
| WO | 2008-147030 A1 | 12/2008 |

* cited by examiner

OIL COOLING DEVICE FOR SERVER AND METHOD FOR DRIVING SAME

TECHNICAL FIELD

The present invention relates to an oil cooling device for a server, and more particularly, to a cooling device capable of heating indoor air and providing hot water by using condensation heat generated from a large-scaled server tower.

BACKGROUND ART

In general, in order to cool a large-scales server tower, an air cooling method is being used rather than a water cooling method. Here, since heat generated through the air cooling method is only dissipated to the outside of the server tower, air conditioner needs to be operated always in order to decrease a temperature of the indoor space in which the server tower is disposed.

Also, even though the heat generated from the server tower is dissipated to the outside, the large number of air blowing fans or a large-scaled air blowing fan is required, and thus power consumption may increase, and also noises generated from the server tower may increase.

Also, if the water cooling method is adopted for a large-scaled server tower used for respective enterprises, when water leaks, significant economic losses may occur due to the damage of the electronic devices within the server tower. Thus, the large-scaled server tower is avoiding to use the water cooling method.

DISCLOSURE OF THE INVENTION

Technical Problem

The present invention has been suggested in consideration of the above-described limitation and has an object to provide an oil cooling device for a server in which insulating cooling oil is used in a cooling device for cooling heat-generating electronic devices of a large-scaled server tower to prevent electronic devices from being damaged.

Also, another object of the present invention is to provide an oil cooling device for a server capable of heating the inside of the building and providing hot water in the building by using condensation heat generated from a cooling system.

Technical Solution

In order to solve the above technical problems, an oil cooling device for a server includes: a server tower having a flow passage through which insulating cooling oil flows; a heat absorbing part for cooling a heat generating electronic device within the server tower; a cooling oil tube connected from the flow passage of the server tower to an external cooling device; a hydraulic pump for circulating the cooling oil in the cooling oil tube; a first temperature sensor disposed in the server tower to detect a temperature variation; a hot water generating tank allowing the cooling oil tube to contact cooling water in the water tank, thereby performing a primary cooling process; a heater allowing the cooling oil tube in which the primary cooling process is performed to contact air, thereby performing a secondary cooling process; a second temperature sensor disposed in the cooling oil tube in which the second cooling process is performed to measure a temperature of the cooling oil tube; a residual-heat processing part having a small-scaled and low-power cooler disposed in the cooling oil tube in which the secondary cooling process is performed to perform a tertiary cooling process; and a control unit for controlling operations of the hydraulic pump and the residual-heat processing part according to a value measured from each of the first and second temperature sensors on the basis of reference temperature data.

Also, the insulating cooling oil may include at least one of insulating liquid of mineral oil, transformer oil, silicon oil, and oil for complete combustion.

Also, the server tower may be applied to a server group for a large-scale enterprise.

Also, the flow passage defined in the server tower may have one end connected to an inflow part through which the cooling oil is introduced into the server tower through the hydraulic pump and the other end connected to a discharge part through which a cooling oil absorbing condensation heat of heat-generating electronic devices into the cooling oil tube, wherein the flow passage may be provided to have the shortest length in the server tower so as to minimize a time for which the heat stays within the server tower.

Also, the heat absorbing part may include: a heat conductive plate of which one surface is in direct contact with a surface of each of the heat-generating electronic devices; and a plurality of fine pipes disposed in the heat conductive plate to allow the cooling oil to flow therethrough so as to maximize a contact area with the heat conductive plate.

Also, the control unit may control the hydraulic pump to increase a flow rate when a temperature detected by the first temperature sensor exceeds a reference temperature range and to decrease the flow rate to a normal rate when the temperature detected by the first temperature sensor returns to the reference temperature range.

Also, the hot water generating tank may have a structure in which the cooling oil tube is bent to increase a contact area with water in the tank, thereby efficiently generating hot water.

Also, the hot water generating tank may include a warm air supply fan on an outer surface thereof to supply warm air in the tank into an indoor space through a duct connected to the tank.

Also, the heater may have a plate or bent shape so as to increase a contact area with air and is disposed at a position required to be heated to supply warm air into the indoor space through an air blowing fan by using the cooling oil tube in which the primary cooling process is performed by the hot water generating tank.

Also, in the heater,
the cooling oil tube in which the primary cooling process is performed by the hot water generating tank may be disposed in the indoor space required to be heated to supply warm air into an indoor space, like a method using an existing radiator.

Also, when a temperature detected by the second temperature sensor exceeds a reference value, the residual-heat processing part may operate under the control of the control unit to perform the tertiary cooling process.

A method for driving an oil cooling device for a server, the method includes: setting a reference temperature range for each of first and second sensors; operating a cooling system of a server tower; measuring a temperature within the server tower through the first temperature sensor; operating a hydraulic pump in a normal mode when a temperature measured by the first temperature sensor is within the reference temperature range and controlling the hydraulic pump to decrease a temperature to the reference temperature range when the temperature measured by the first temperature sensor exceeds the reference temperature range; performing a primary cooling process by allowing a cooling oil tube to contact cooling water within a water tank; performing a secondary cooling process by allowing the cooling oil tube in which the primary cooling process is performed to contact air; measuring a temperature of the cooling oil tube through a second temperature sensor after the secondary cooling process is completed; and operating a residual-heat processing part to decrease the temperature of the cooling oil tube to the reference temperature range when the temperature of the cooling oil tube measured by the second temperature sensor exceeds the reference temperature range, thereby performing a tertiary cooling process on cooling oil introduced into the server tower.

Advantageous Effects

The present invention may have a unique effect because the insulting cooling oil is used to prevent the electronic devices within the server tower from being damaged even though the oil leaks, unlike the existing water cooling type cooling device.

Also, the present invention may have a unique effect because the condensation heat generated from the cooling system is used to heat the inner space of the building and to provide the hot water into the building.

DESCRIPTIONS OF THE REFERENCE NUMERALS OF THE DRAWINGS

100: Server tower 120: First temperature sensor
200: Heat absorbing part 300: Cooling oil tube
310: Second temperature sensor 400: Hydraulic pump
500: Water tank 600: Heater
700: Residual-heat processing part 800: Control unit

MODE FOR CARRYING OUT THE INVENTION

Technical configurations and effects with respect to a oil cooling device for a server and a method for driving the same according to the present invention will become apparent with the detailed descriptions of the preferred embodiment and the illustrations of the related drawings as follows.

An oil cooling device for a server according to the present invention includes a server tower having a flow passage through which insulating cooling oil flows, a heat absorbing part for cooling a heat generating electronic device within the server tower, a cooling oil tube connected from the flow passage of the server tower to an external cooling device, a hydraulic pump for circulating the cooling oil in the cooling oil tube, a first temperature sensor disposed in the server oil tube to detect a temperature variation, a hot water generating tank allowing the cooling oil tube to contact cooling water in the water tank, thereby performing a primary cooling process, a heater allowing the cooling oil tube in which the primary cooling process is performed to contact air, thereby performing a secondary cooling process, a second temperature sensor disposed in the cooling oil tube in which the second cooling process is performed to measure a temperature of the cooling oil tube, a residual-heat processing part having a small-scaled and low-power cooler disposed in the cooling oil tube in which the secondary cooling process is performed to perform a tertiary cooling process, and a control unit for controlling operations of the hydraulic pump and the residual-heat processing part according to a value measured from each of the first and second temperature sensors on the basis of reference temperature data.

Hereinafter, a preferred embodiment of the present invention will be described with reference to the accompanying drawings.

Figure 1:
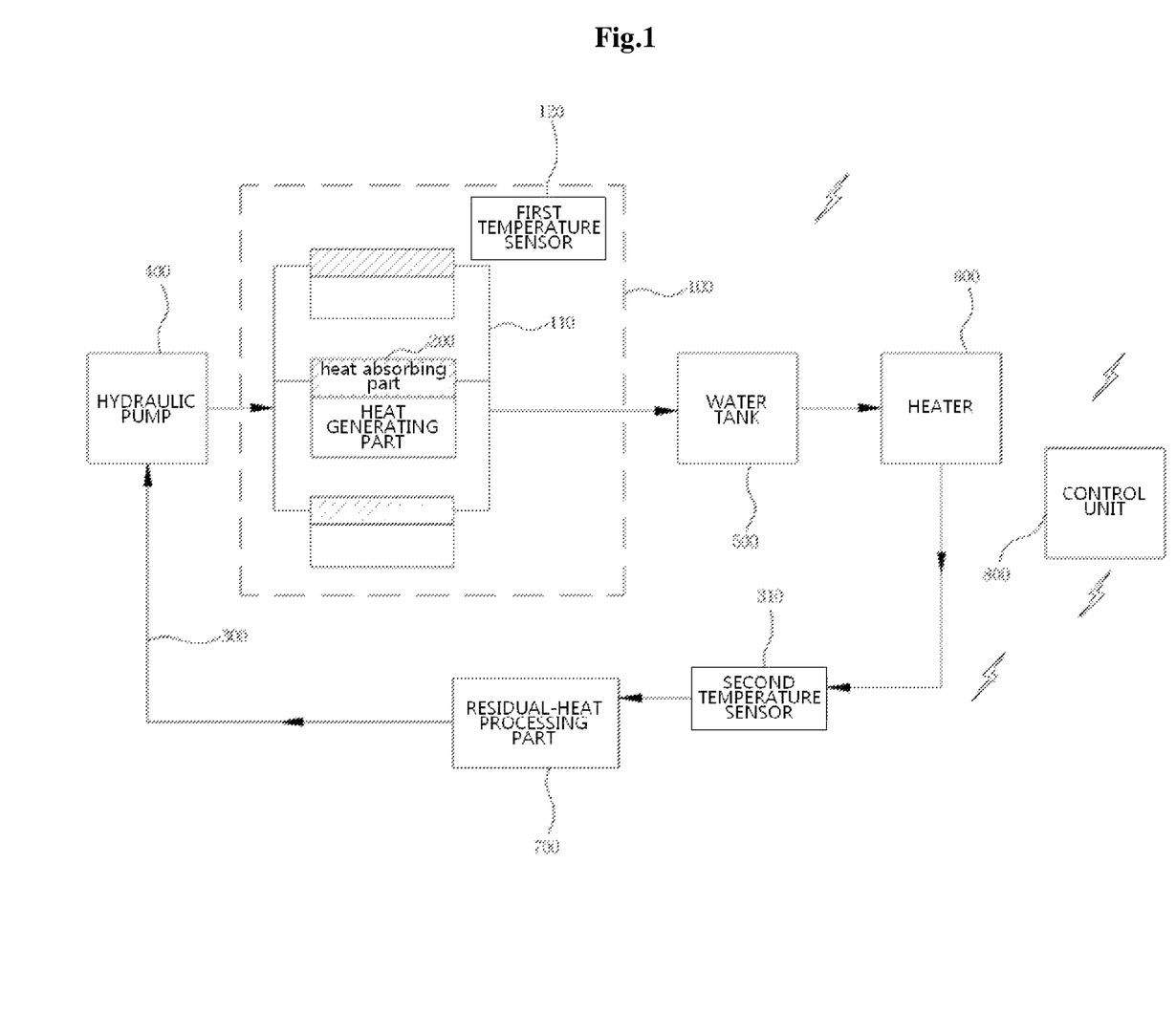
FIG. 1 is a schematic view of a heating and hot-water supply apparatus using an oil cooling device for a sever according to the present invention.

FIG. 1 is a schematic view of an oil cooling device for a sever according to an embodiment of the present invention.

Figure 2:
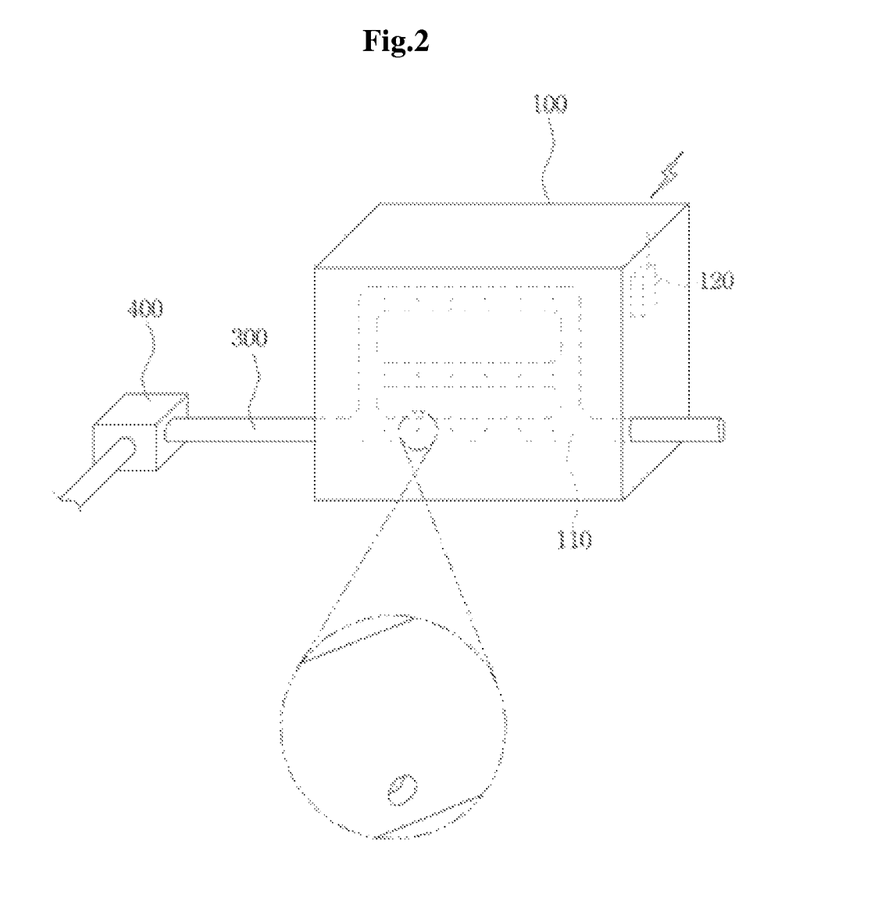
FIG. 2 is a perspective view of a server tower of the oil cooling device for the server according to the present invention.

As illustrated in FIG. 2, the server tower 100 is constituted by the flow passage 110 and the first temperature sensor 120 disposed in the server tower 100 to measure a temperature of the server tower 100. The flow passage 110 has one end connected to an inflow part through which the cooling oil is introduced into the server tower 100 through the hydraulic pump 400 and the other end connected to a discharge part through which the cooling oil absorbing condensation heat of the heat-generating electronic device is discharged into the cooling oil tube. The flow passage 110 has the shortest length in the server tower 100 so as to minimize a time for which heat stays within the server tower 100.

The server tower 100 may be applied to a server group for a large-scale enterprise to obtain the maximum condensation heat.

Although the insulating cooling oil applied to the present invention is one of mineral oil, transformer oil, silicon oil, or oil for complete combustion that is capable of preventing the electronic device from being damaged even though the oil leaks, if other allowable insulating liquids are used instead of the insulating cooling oil, it should not be departed from the scope of the present invention.

The flow passage 110 may be punched at a predetermined interval to match a position of the heat-generating electronic device along a longitudinal direction thereof and then be coupled to a fine pipe 220 of the heat absorbing part 200. FIG. 2 is a perspective view of a server tower of the oil cooling device for the server according to the present invention.

Figure 3:
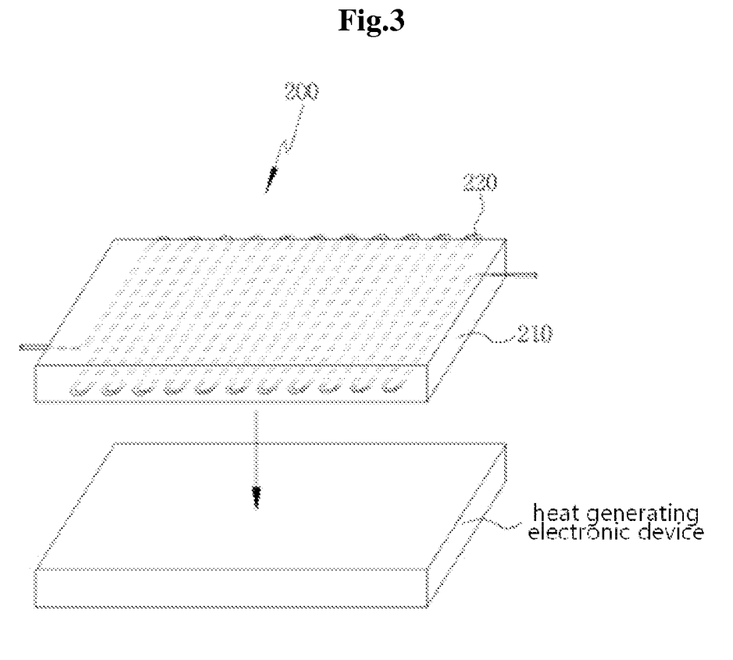
FIG. 3 is a perspective view of a heat absorbing part of the oil cooling device for the server according to the present invention.

As illustrated in FIG. 3, the heat absorbing part 200 includes a heat conductive plate 210 having one surface that is in direct contact with a surface of the heat-generating electronic device and a plurality of fine pipes 220 disposed in the heat conductive plate 210 so as to maximize a contact surface with the heat conductive plate 210.

In order to maximize the contact area between the fine pipes 220 and the heat conductive plate 210, each of the fine pipes 220 may be bent so that the fine pipe 220 has the longest length in the heat conductive plate 210. FIG. 3 is a perspective view of a heat absorbing part of the oil cooling device for the server according to the present invention.

Figure 4:
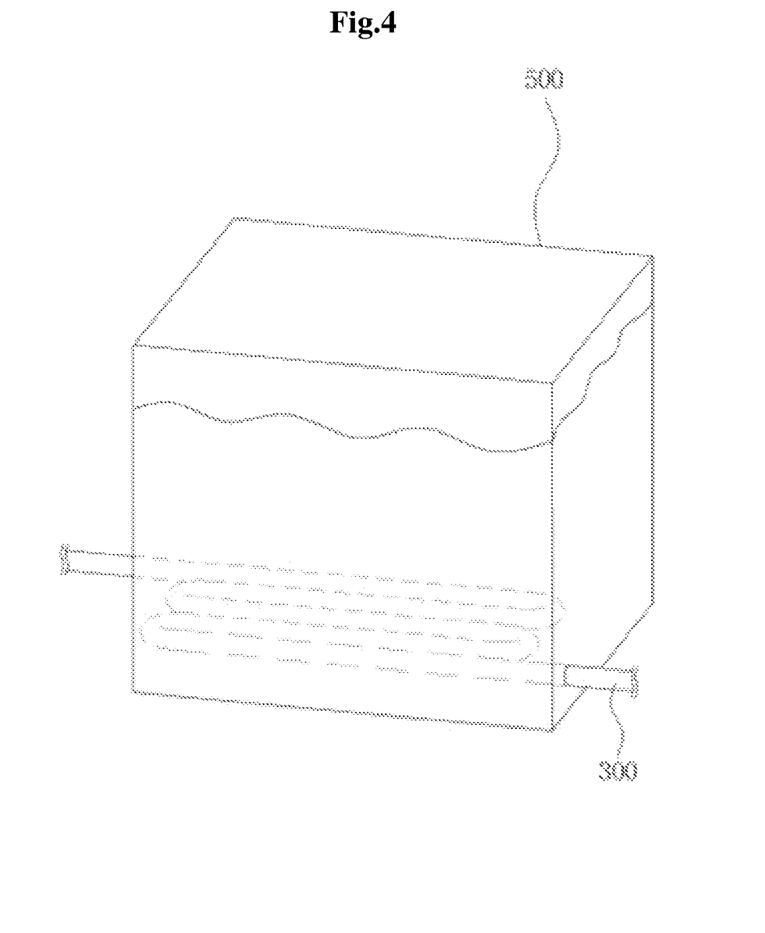
FIG. 4 is a perspective view of a hot water generating tank of the oil cooling device for the server according to the present invention.
Figure 5:
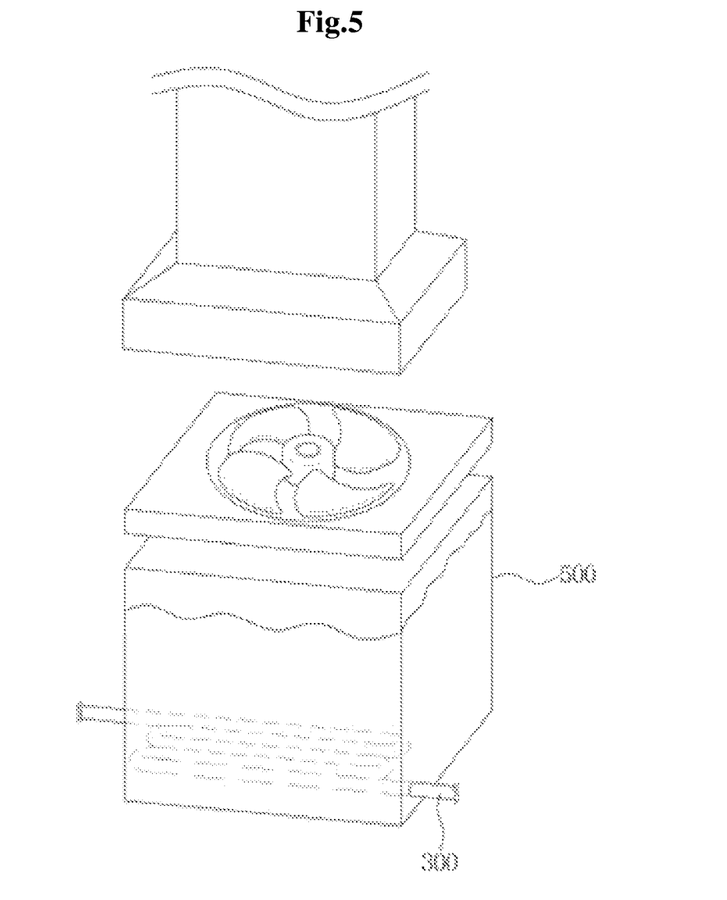
FIG. 5 is a perspective view of a hot water generating tank and a heater of an oil cooling device for a server according to another embodiment of the present invention.

As illustrated in FIG. 4, in order to efficiently generate hot water and efficiently cool the cooling oil tube 300, the hot water generating tank 500 has a structure in which the cooling oil tube 300 is bent to increase a contact area with water within the hot water generating tank 500. FIG. 5 is a perspective view of a hot water generating tank for a sever according to the present invention.

FIG. 5 is a perspective view of a hot water generating tank of an oil cooling device for a sever according to another present invention. As illustrated in FIG. 5, the hot water generating tank 500 according to the present example is characterized in that a fan for supplying warm air into an indoor space is disposed on an outer surface of the hot water generating tank 500 to supply the warm air into the indoor space through a duct to be connected to the hot water generating tank.

Figure 6:
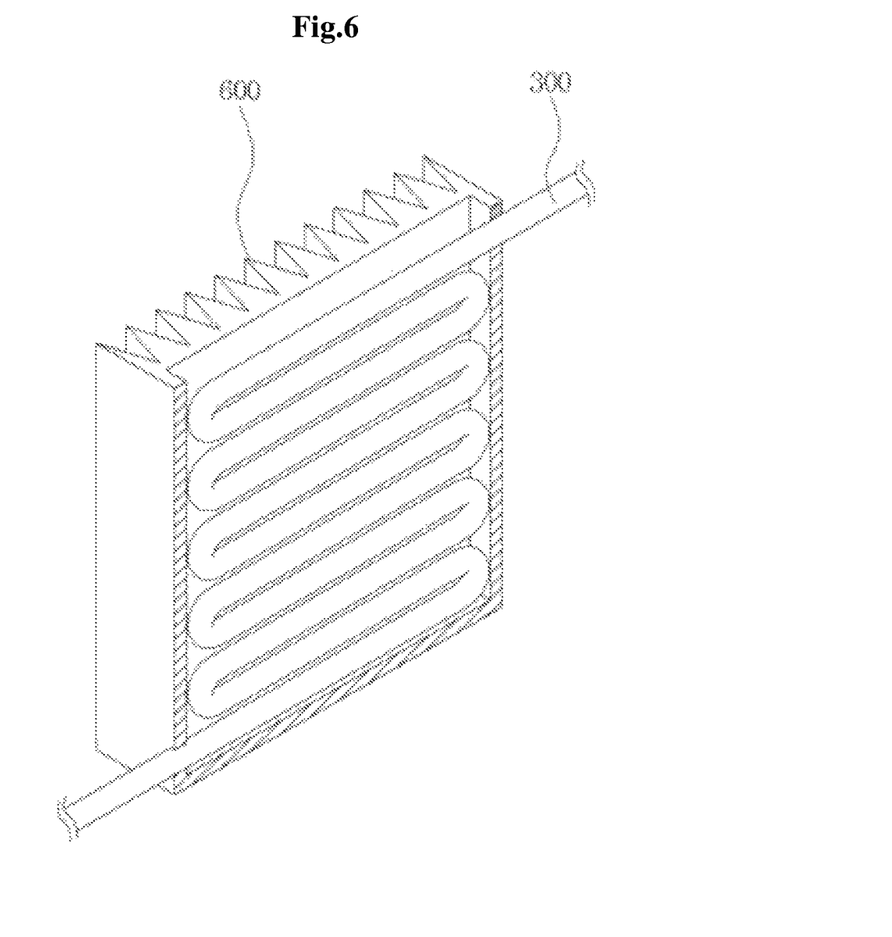
FIG. 6 is a view of the oil cooling device for the server according to the present invention.

As illustrated in FIG. 6, the heater 600 may use residual heat of the cooling oil tube 300 in which the primary cooling process is performed by the hot water generating tank 500 and may be installed at a position, at which heating is required, in a plate shape or bent shape to increase the contact area with the air, thereby supplying the warm air into the indoor space through an air-blowing fan. FIG. 6 is a view of a heater of the oil cooling device for the server according to the present invention.

Figure 7:
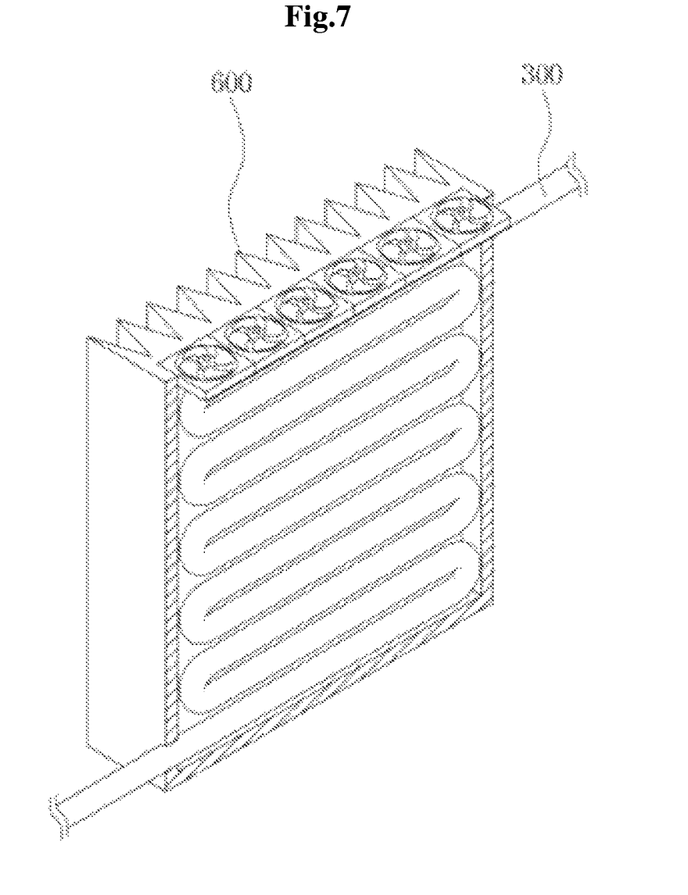
FIG. 7 is a view of an oil cooling device for a server according to another embodiment of the present invention.

FIG. 7 is a view of a heater of an oil cooling device for a server according to another embodiment of the present invention. As illustrated in FIG. 7, the heater 600 has a structure in which the cooling oil tube 300 in which the primary cooling process is performed by the hot water generating tank 500 is disposed in the indoor space in which the heating is required to supply the warm air, like the method using the existing radiator.

The control unit 800 may control the hydraulic pump 400 to increase a flow rate when a temperature detected by the first temperature sensor 120 exceeds a reference temperature range on the basis of preset reference temperature data for each sensor and to decrease the flow rate to a normal rate when the detected temperature returns to the reference temperature range. Also, the control unit 800 may operate the residual-heat processing part 700 when a temperature detected by the second temperature sensor 310 exceeds the reference temperature range.

The second temperature sensor 310 may be disposed between the residual-heat processing part 700 and the heater 600 for performing the secondary cooling process to measure a temperature of the cooling oil tube 300 in which the secondary cooling process is completed, thereby transmitting the measured temperature value to the control unit 800.

Figure 8:
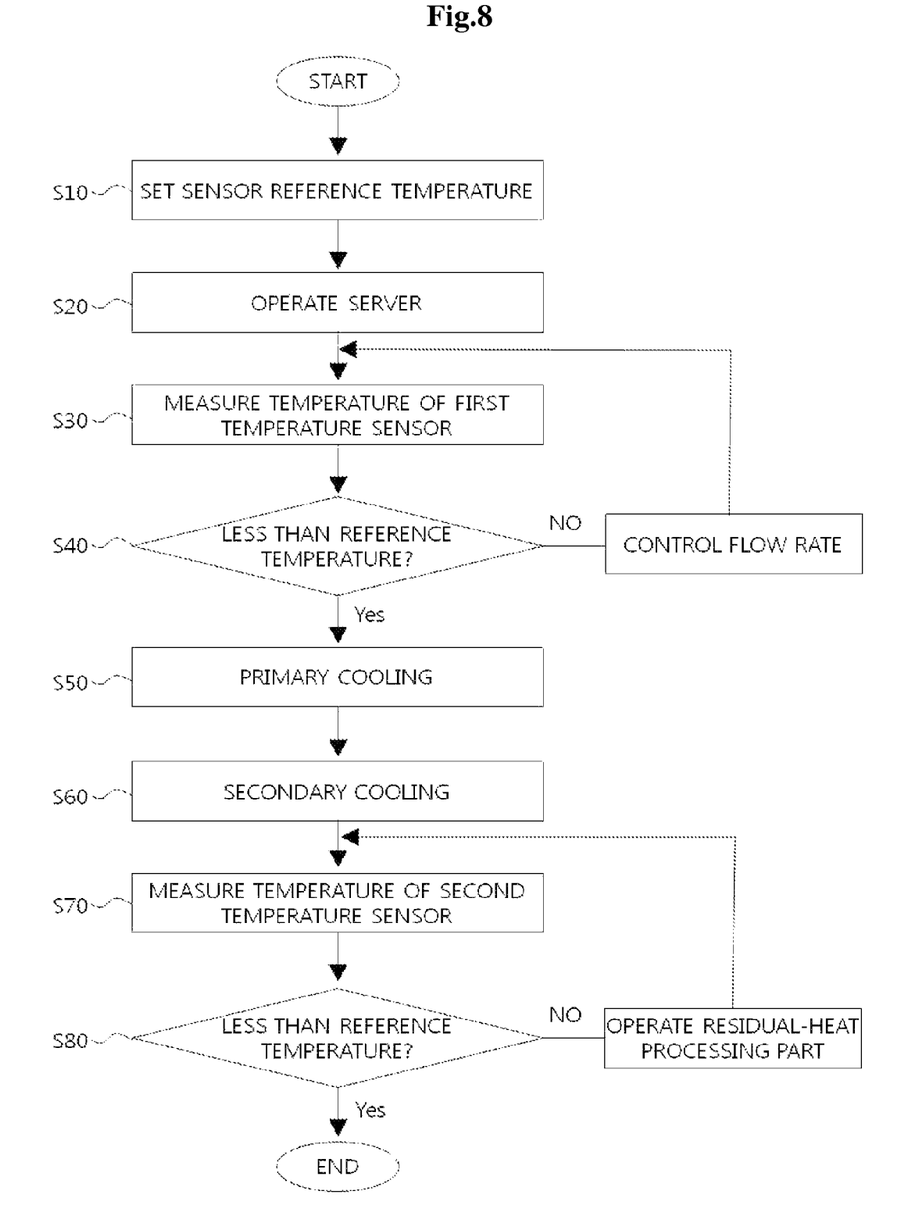
FIG. 8 is a flowchart illustrating an operation of the oil cooling device for the server according to the present invention.

FIG. 8 is a flowchart illustrating an operation of the oil cooling device for the server according to the present invention.

As illustrated in FIG. 8, in operation S10, a manager sets a reference temperature range of each of the first and second temperature sensors 120 and 310 to input a preset value into each of the sensor parts and the control unit 800.

Also, in operation S20, a cooling system of the server tower 100 may operate on the bases of the preset reference temperature range.

Also, in operation S30, the first temperature sensor 120 disposed in the server tower measures a temperature in the server tower 100.

Also, in operation S40, the control unit 800 may operate in a normal mode when the measured temperature is within the reference temperature range and may control the hydraulic pump 400 to increase the flow rate when the measured temperature exceeds the reference temperature range so that the temperature decreases to the reference temperature range.

Also, in operation S50, the cooling oil tube 300 contacts the cooling water within the water tank 500 to perform the primary cooling process, thereby generating the hot water.

Also, in operation S60, the cooling oil tube 300 in which the operation S50 is performed contacts the air through the heater 600 to perform the secondary cooling process.

Also, after the operation S60 is completed, the second temperature sensor 310 measures a temperature of the cooling oil tube 300 in operation S70.

Lastly, in operation S80, when the temperature of the cooling oil tube 300 measured by the second temperature sensor 310 exceeds the reference temperature range, the control unit 800 may operate the residual-heat processing part 800 to perform the tertiary cooling process on the cooling oil introduced into the server tower 100, thereby decreasing the temperature of the cooling oil tube 300 into the reference temperature range.

The above-disclosed subject matter is to be considered illustrative, and not restrictive, and the appended claims are intended to cover all such modifications, enhancements, and other embodiments, which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description. Therefore, the present invention performs the same function as evenly invention also belongs to the scope of the present invention, it will be granted.

As described above, the present invention may have an unique effect because the insulting cooling oil is used to prevent the electronic devices within the server tower from being damaged even though the oil leaks, unlike the existing water cooling type cooling device. Also, the present invention may have an unique effect because the condensation heat generated from the cooling system is used to heat the inner space of the building and to provide the hot water into the building.

As described above, the present invention has an unique effect because the insulting cooling oil is used unlike the existing water cooling device to prevent the electronic devices within the server tower from being damaged even though the oil leaks.

Also, the present invention has an unique effect because the condensation heat generated from the cooling system is used to heat the inside of the building and to provide the hot water in the building.

The invention claimed is:

1. An oil cooling device for a server, comprising:
    a server tower having a flow passage through which insulating cooling oil flows;
    a heat absorbing part for cooling a heat generating electronic device within the server tower;
    a cooling oil tube connected from the flow passage of the server tower to an external cooling device;
    a hydraulic pump for circulating the cooling oil in the cooling oil tube;
    a first temperature sensor disposed in the server tower to detect a temperature variation;
    a hot water generating tank allowing the cooling oil tube to contact cooling water in the water tank, thereby performing a primary cooling process;
    a heater allowing the cooling oil tube in which the primary cooling process is performed to contact air, thereby performing a secondary cooling process;

a second temperature sensor disposed in the cooling oil tube in which the second cooling process is performed to measure a temperature of the cooling oil tube;

a residual-heat processing part having a small-scaled and low-power cooler disposed in the cooling oil tube in which the secondary cooling process is performed to perform a tertiary cooling process; and a control unit for controlling operations of the hydraulic pump and the residual-heat processing part according to a value measured from each of the first and second temperature sensors on the basis of reference temperature data.

2. The oil cooling device of claim 1, wherein the insulating cooling oil comprises at least one of insulating liquid of mineral oil, transformer oil, silicon oil, and oil for complete combustion.

3. The oil cooling device of claim 1, wherein the server tower is applied to a server group for a large-scale enterprise.

4. The oil cooling device of claim 1, wherein the flow passage defined in the server tower has one end connected to an inflow part through which the cooling oil is introduced into the server tower through the hydraulic pump and the other end connected to a discharge part through which a cooling oil absorbing condensation heat of heat-generating electronic devices into the cooling oil tube, wherein the flow passage is provided to have the shortest length in the server tower so as to minimize a time for which the heat stays within the server tower.

5. The oil cooling device of claim 1, wherein the heat absorbing part comprises:

a heat conductive plate of which one surface is in direct contact with a surface of each of the heat-generating electronic devices; and a plurality of fine pipes disposed in the heat conductive plate to allow the cooling oil to flow therethrough so as to maximize a contact area with the heat conductive plate.

6. The oil cooling device of claim 1, wherein the control unit controls the hydraulic pump to increase a flow rate when a temperature detected by the first temperature sensor exceeds a reference temperature range and to decrease the flow rate to a normal rate when the temperature detected by the first temperature sensor returns to the reference temperature range.

7. The oil cooling device of claim 1, wherein the hot water generating tank has a structure in which the cooling oil tube is bent to increase a contact area with water in the tank, thereby efficiently generating hot water.

8. The oil cooling device of claim 1, wherein the hot water generating tank comprises a warm air supply fan on an outer surface thereof to supply warm air in the tank into an indoor space through a duct connected to the tank.

9. The oil cooling device of claim 1, wherein the heater has a plate or bent shape so as to increase a contact area with air and is disposed at a position required to be heated to supply warm air into the indoor space through an air blowing fan by using the cooling oil tube in which the primary cooling process is performed by the hot water generating tank.

10. The oil cooling device of claim 1, wherein, in the heater, the cooling oil tube in which the primary cooling process is performed by the hot water generating tank is disposed in the indoor space required to be heated to supply warm air into an indoor space, like a method using an existing radiator.

11. The oil cooling device of claim 1, wherein, when a temperature detected by the second temperature sensor exceeds a reference value, the residual-heat processing part operates under the control of the control unit to perform the tertiary cooling process.

12. A method for driving an oil cooling device for a server, the method comprising:

setting a reference temperature range for each of first and second sensors;

operating a cooling system of a server tower;

measuring a temperature within the server tower through the first temperature sensor;

operating a hydraulic pump in a normal mode when a temperature measured by the first temperature sensor is within the reference temperature range and controlling the hydraulic pump to decrease a temperature to the reference temperature range when the temperature measured by the first temperature sensor exceeds the reference temperature range;

performing a primary cooling process by allowing a cooling oil tube to contact cooling water within a water tank;

performing a secondary cooling process by allowing the cooling oil tube in which the primary cooling process is performed to contact air;

measuring a temperature of the cooling oil tube through a second temperature sensor after the secondary cooling process is completed; and operating a residual-heat processing part to decrease the temperature of the cooling oil tube to the reference temperature range when the temperature of the cooling oil tube measured by the second temperature sensor exceeds the reference temperature range, thereby performing a tertiary cooling process on cooling oil introduced into the server tower.

* * * * *